United States Patent
Liu et al.

(10) Patent No.: US 8,324,645 B2
(45) Date of Patent: Dec. 4, 2012

(54) OPTICAL DEVICE FOR SEMICONDUCTOR BASED LAMP

(75) Inventors: Keh Shium Liu, Hsinchu (TW); Yun Yuan Chu, Taipei (TW)

(73) Assignee: Pinecone Energies, Inc., Tortola (VG)

( * ) Notice: Subject to any disclaimer, the term of this patent is extended or adjusted under 35 U.S.C. 154(b) by 30 days.

(21) Appl. No.: 12/837,370

(22) Filed: Jul. 15, 2010

(65) Prior Publication Data

US 2011/0140149 A1   Jun. 16, 2011

(51) Int. Cl.
*H01L 33/00* (2010.01)
(52) U.S. Cl. .................. 257/98; 257/E33.072
(58) Field of Classification Search .............. 257/98, 257/E33.072
See application file for complete search history.

(56) References Cited

U.S. PATENT DOCUMENTS

| 6,758,582 | B1 | 7/2004 | Hsiao | |
| 7,066,628 | B2* | 6/2006 | Allen | 362/267 |
| 7,080,924 | B2 | 7/2006 | Tseng | |
| 2006/0268555 | A1 | 11/2006 | Kelly | |
| 2009/0296387 | A1 | 12/2009 | Reisenauer | |
| 2009/0310368 | A1 | 12/2009 | Incerti | |

FOREIGN PATENT DOCUMENTS

WO   WO 2006092697 A1 *  9/2006

* cited by examiner

*Primary Examiner* — Bradley K Smith
*Assistant Examiner* — Amar Movva
(74) *Attorney, Agent, or Firm* — Huffman Law Group, P.C.

(57) ABSTRACT

This invention discloses an optical device for a semiconductor based lamp, the optical device comprising a base for mounting a semiconductor based light-emitting device, and a light-redirecting member having an opening and a reflective surface next to the opening, wherein the opening is aligned directly above the semiconductor based light-emitting device, and the reflective surface redirects light emitted from the semiconductor-based light-emitting device to lateral directions.

19 Claims, 4 Drawing Sheets

OPTICAL DEVICE FOR SEMICONDUCTOR BASED LAMP

BACKGROUND

The present invention relates generally to electrical lighting devices, and, more particularly, to an electrical lighting device utilizing light emitting diodes (LEDs).

A Light-emitting diode (LED) is a semiconductor diode based light source. When a diode is forward biased (switched on), electrons are able to recombine with holes within the device, releasing energy in the form of photons. This effect is called electroluminescence and the color of the light (corresponding to the energy of the photon) is determined by the energy gap of the semiconductor. When used as a light source, the LED presents many advantages over incandescent light sources. These advantages include lower energy consumption, longer lifetime, improved robustness, smaller size, faster switching, and greater durability and reliability.

However, LED as light source has its disadvantages. One of the disadvantages is that the light emitted from a LED chip concentrates in a direction normal or perpendicular to the surface of the LED chip, i.e., LED light is strong in the upright direction and drastically diminished in the sideway directions. In order to make a LED light more like a traditional incandescent light source with uniform light emitting intensity in all directions, reflectors has been used to redirect the LED beam from upright to sideways. However, redirecting light merely sacrifices light in the upright direction in favor of sideway directions and may not be an efficient uniform wide-angle light source.

As such, what is desired is a LED light bulb that can uniformly emit light in most directions from the LED chip.

SUMMARY

This invention discloses an optical device for a semiconductor based lamp, the optical device comprising a base for mounting a semiconductor based light-emitting device, and a light-redirecting member having an opening and a reflective surface next to the opening, wherein the opening is aligned directly above the semiconductor based light-emitting device, and the reflective surface redirects light emitted from the semiconductor-based light-emitting device to lateral directions.

The construction and method of operation of the invention, however, together with additional objectives and advantages thereof will be best understood from the following description of specific embodiments when read in connection with the accompanying drawings.

BRIEF DESCRIPTION OF THE DRAWINGS

The drawings accompanying and forming part of this specification are included to depict certain aspects of the invention. A clearer conception of the invention, and of the components and operation of systems provided with the invention, will become more readily apparent by referring to the exemplary, and therefore non-limiting, embodiments illustrated in the drawings, wherein like reference numbers (if they occur in more than one view) designate the same elements. The invention may be better understood by reference to one or more of these drawings in combination with the description presented herein.

DESCRIPTION

The present invention discloses an optical device for semiconductor based lamp. The optical device spreads semiconductor based lamp's directional light to directions of a wide angle, so that the light emitting pattern of the semiconductor based lamp resembles that of a traditional incandescent light bump.

Figure 1:
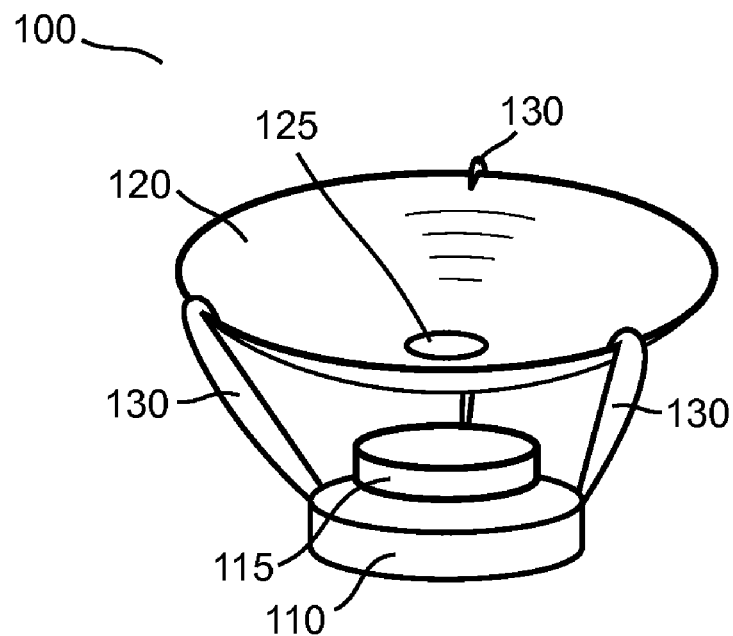
FIG. 1 is a perspective view of an optical device for a LED lamp according to an embodiment of the present invention.

FIG. 1 is a perspective view of an optical device 100 for a LED lamp according to an embodiment of the present invention. The optical device 100 comprises a base 110 on which a LED device 115 is mounted. The LED device 115 can be formed in a single semiconductor substrate or by an array of LEDs. A cone-shaped light-redirecting member 120 is secured to the base 110 by three legs 130. The legs 130 may be on the outside of or under the light redirection member 120. The legs 130 may be knife-shaped with knife edge toward a central axis of the light redirection member 120 to avoid light shielding. Or, the legs 130 may be made of thin wires to avoid light shielding. Using metal to construct the light-redirecting member 120 and the mounting legs 130 has a benefit of better dissipating heat generated by the LED device 115.

Referring to FIG. 1 again, the light-redirecting member 120 has an opening 125 in the center thereof. The opening 125 is positioned directly above the LED device 115.

Figure 2:
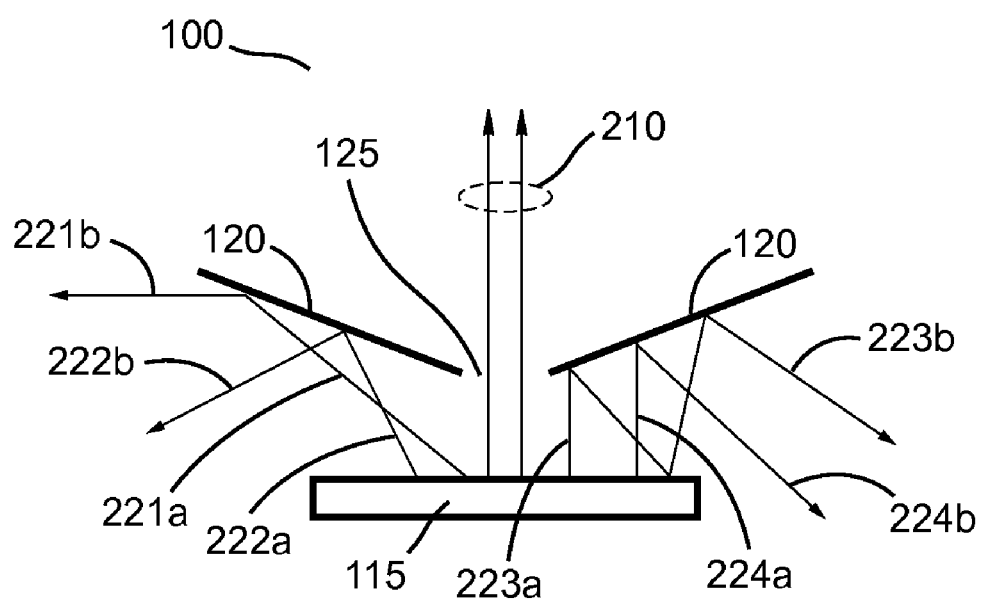
FIG. 2 illustrates the working mechanism of the optical device shown in FIG. 1.

FIG. 2 illustrates the working mechanism of the optical device 100 shown in FIG. 1. A diameter of the opening 125 is smaller than a diameter of the semiconductor device 115. Light beams 210 emitted from the center of the LED device 115 goes right through the opening 125. Light beams 221a, 222a, 223a, 224a emitted from the peripheral area of the LED device 115 are reflected by the cone-shaped light-redirecting member 120 into lateral beams 221b, 222b, 223b, 224b. Therefore, the optical device 100 allows both the upright light beams 210 and lateral beams 221b, 222b, 223b, 224b to be emitted from the LED device 115.

Furthermore, FIG. 2 shows the light beams 223a and 224a that in a normal angle to the surface of the LED device 115. The LED device 115 also emits light beams 221a and 222a in off-normal directions albeit not as intense as the normal directional beams 223a and 224a. A sum of these light beams, both normal (223a and 224a) and off-normal (221a and 222a), provides a light source that has a relatively uniform dispersion pattern in more directions from the LED device 115.

Figure 3:
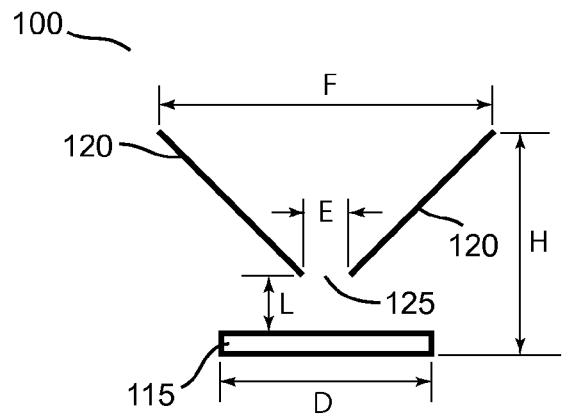
FIG. 3 illustrates dimensional considerations of the optical device for achieving a uniform light dispersion pattern.

FIG. 3 illustrates dimensional considerations of the optical device 100 for achieving a uniform light dispersion pattern. A height H of the optical device 100 is measured from the top of the light-redirecting member 120 to the bottom of the LED device 115. A width F of the optical device 100 is generally measured as a diameter of the light-redirecting member 120. In order to retrofit the optical device 100 into a limited space of a traditional incandescent light bulb, a ratio of the height H to the diameter D of the LED device 115, i.e., H over D, and the width F to the diameter D of the LED device 115, i.e., F over D, must both be less than four. The above ratios can be more critical when the diameter D of the LED device 115 is equal to or above one forth of the bulb diameter. In generally, a ratio between a diameter F of the light-redirecting member 120 and a diameter D of the LED device 115 is between 0.7 and 2. A ratio between a diameter E of the opening 125 and the diameter D of the LED device 115 should be less than 0.7. Although not shown in FIG. 3, FIG. 1 shows that the LED device 115 is mounted on the base 110. Preferably the dimension of the base 110 is larger than that of the LED device 115.

Figure 4A:
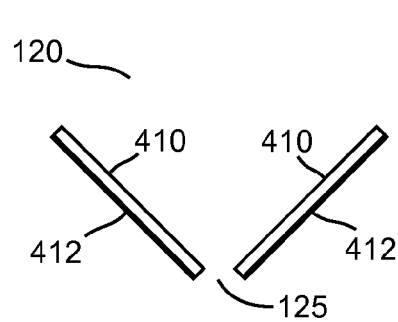
FIGS. 4A-4G illustrate several alternative light redirecting features that can be applied to the LED lamp of FIG. 1.

FIG. 4A-4G illustrate several alternative light redirecting features that can be applied to the LED lamp 100 of FIG. 1. Referring to FIG. 4A, the light-redirecting member 120 is comprised of a cone-shaped plate structure 410 made of a material of plastic, glass or metal. A reflective layer 412 is then plated on the bottom of the plate structure 410.

Figure 4B:
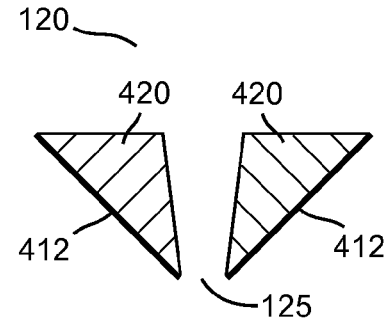

Alternatively, FIG. 4B illustrates a solid structure 420 with cone-shaped surface plated with a reflective layer 412. The solid structure 420 preserve the opening 125 for allowing light to be directly emitted in the upright direction.

Figure 4C:
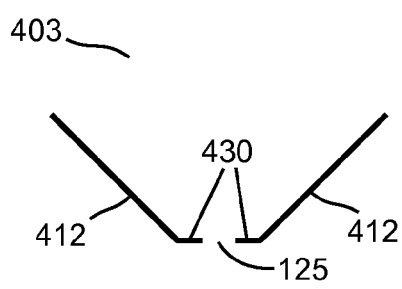

Referring to FIG. 4C, the light-redirecting member 403 comprises a flat ring 430 surrounding the center opening 125. A reflective surface follows the contours of the bottom surfaces 412 and 430.

Figure 4D:
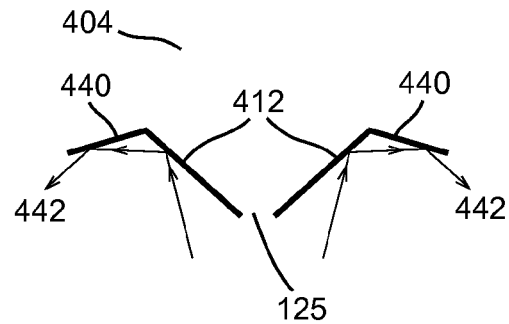

Referring to FIG. 4D, the light-redirecting member 404 comprises a bottom facing reflective surface 440 as an outer ring of the reflective surface 412. With the addition of the bottom facing reflective surface 440, some of the light beams, such as 442, is re-directed downward. As a result, light emitting pattern from such light-redirecting member 120 is more of a global pattern.

Figure 4E:
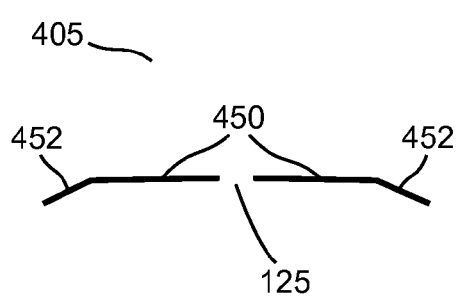

Referring to FIG. 4E, a main portion of the reflective surface 450 is approximately horizontally positioned, so that more emitted light will be reflected downward. Slanted surface 452 surrounding the horizontal reflective surface 450 makes more light to be reflected downward.

Figure 4F:
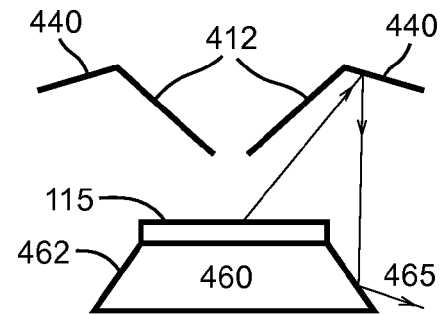

Referring to FIG. 4F, the LED device 115 is raised by a protruding member 460. The protruding member 460 has side reflective surfaces 462. A light beam 465 is reflected twice, once by the bottom facing reflective surface 440 and the other by the side reflective surface 462. Such structure is also instrumental for achieving a more global light-emitting pattern.

Figure 4G:
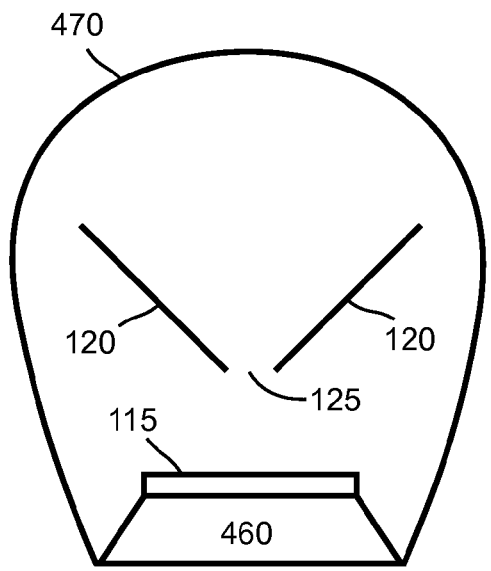

Referring to FIG. 4G, a frosted semi-transparent cover 470 encloses a LED light source with the light-redirecting member 120 for further enhancing the uniformity of emitted light intensity. Such LED light source more resembles a traditional incandescent light bulb.

Figure 5A:
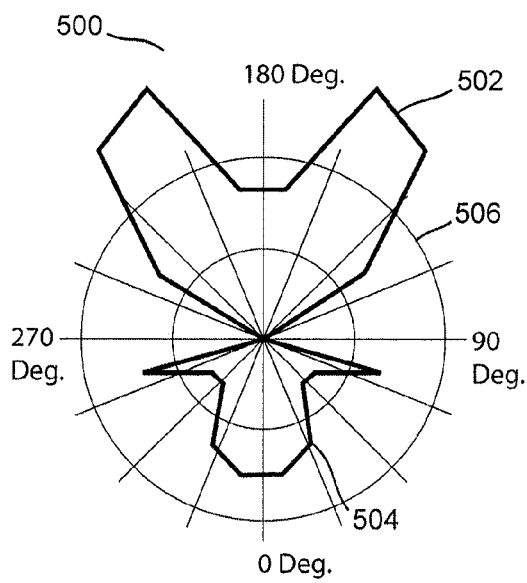
FIGS. 5A and 5B illustrate simulation results of the LED lamps based on FIGS. 5C and 5D of the present invention.
Figure 5B:
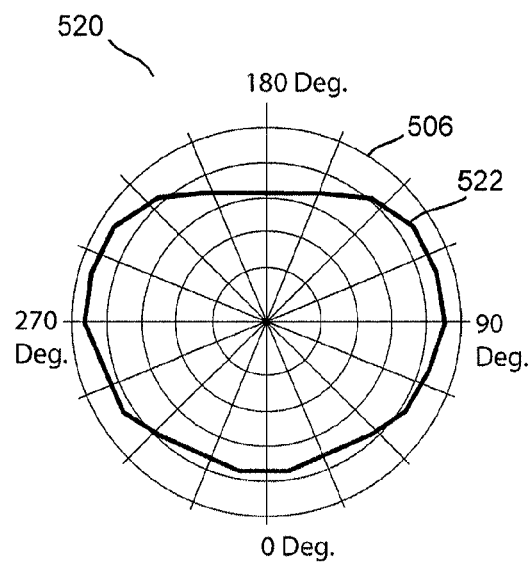
Figure 5C:
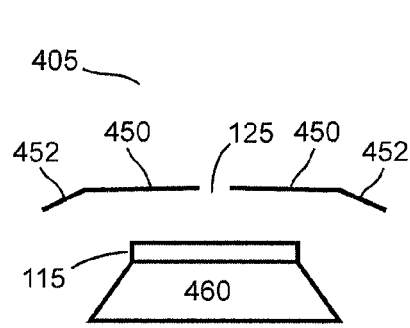
Figure 5D:
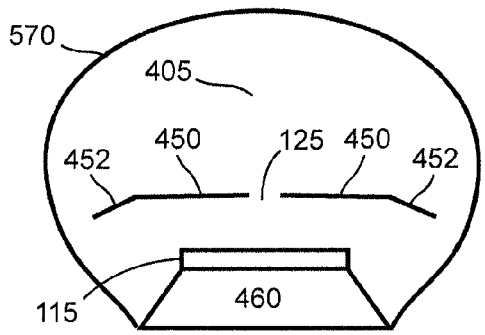

FIGS. 5A and 5B illustrate simulation results of the LED lamps based on FIGS. 5C and 5D of the present invention. Referring to FIG. 5A, circular polar plot 500 shows far-field distribution (light intensity distribution) 502 and 504 on circular angular scale 506, with off-axis angle, with zero denoting the on-axis direction, and 180 degree the opposite direction, totally backward. This is possible for those preferred embodiments having some sideways extension so that 180 degree is unimpeded by the source. Referring to FIG. 5C, a diameter of the LED device 115 is 20 mm. A width of the light-redirecting member 405 is 32 mm. A diameter of the opening 125 of the light-redirecting member 405 is 12 mm. A distance between a top of the light-redirecting member 405 and the surface of the LED device 115 is 8 mm. The far-field distribution 502 shows that light intensity below the LED device 115 has fairly large intensity. The far-field distribution 504 shows that light is also emitted to above the LED device 115.

Referring to FIG. 5B, far-field distribution 520 is obtained when a frosted cover 570 similar to the frosted cover 470 of FIG. 4G is applied as shown in FIG. 5D. The far-field distribution 522 shows that the light emitting pattern is close to a circle which means that light is emitted from the LED lamp uniformly in all directions.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. An optical device for a semiconductor based lamp, the optical device comprising:
   a base for mounting a semiconductor based light-emitting device; and
   a light-redirecting member having an opening and a reflective surface next to the opening,
   wherein the opening is aligned directly above the semiconductor-based light-emitting device, enabling some light emitted from the semiconductor-based light-emitting device to travel upwardly into an environment surrounding the lamp;
   wherein the reflective surface redirects at least some of the remainder of the light emitted from the semiconductor-based light-emitting device ambiently, away from the lamp, and into a surrounding environment in divergent lateral and at least partially downward directions, without further reflection; and
   wherein the optical device radiates light broadly and divergently about the optical device into the surrounding environment, including generally upward, lateral, and at least partially downward directions.

2. The optical device of claim 1, wherein the light-redirecting member is secured to the base by a plurality of legs, radially distributed about the base, connecting an outer periphery of the base to an outer periphery of the light-redirecting member.

3. The optical device of claim 1, wherein the reflective surface is cone-shaped and surrounds the opening.

4. The optical device of claim 1, wherein the light-redirecting member is formed by a thin sheet of metal.

5. The optical device of claim 1, wherein the reflective surface is formed by plating reflective material on a plastic material.

6. The optical device of claim 1, wherein the light-redirecting member is formed by a cone-shaped solid material with an opening in the middle and an outer surface plated with a light reflective material.

7. The optical device of claim 1, further comprising a frosted semi-transparent cover enclosing the semiconductor-based light emitting device and the light-redirecting member.

8. An optical device for a semiconductor based lamp, the optical device comprising:
   a base for mounting one or more light emitting diodes; and
   a light-redirecting member having an opening and a reflective surface next to the opening,
   wherein the opening is aligned directly above the light emitting diodes, enabling some light emitted from the light emitting diodes to travel upwardly into an environment surrounding the lamp;

wherein the reflective surface redirects at least some of the remainder of the light emitted from the light emitting diodes ambiently, away from the lamp, and into a surrounding environment in divergent lateral and at least partially downward directions, without further reflection; and wherein the optical device radiates light broadly and divergently about the optical device into the surrounding environment, including generally upward, lateral, and at least partially downward directions.

9. The optical device of claim 8, wherein the light-redirecting member is secured to the base by a plurality of legs, radially distributed about the base, connecting an outer periphery of the base to an outer periphery of the light-redirecting member.

10. The optical device of claim 8, wherein the reflective surface is cone-shaped and surrounds the opening.

11. The optical device of claim 8, wherein the light-redirecting member is formed by a thin sheet of metal.

12. The optical device of claim 8, wherein the reflective surface is formed by plating reflective material on a plastic material.

13. The optical device of claim 8, wherein the light-redirecting member is formed by a cone-shaped solid material with an opening in the middle and an outer surface plated with a light reflective material.

14. The optical device of claim 8, further comprising a frosted semi-transparent cover enclosing the entire light emitting diodes LEDs and the light-redirecting member.

15. The optical device of claim 2, wherein the legs have elongated cross sections, wherein each leg has an elongated dimension oriented toward a central axis of the light-redirecting member, the orientation of the legs serving to minimize light shielding by the legs.

16. An optical device for a semiconductor based lamp, the optical device comprising:

a base for mounting one or more semiconductor based light emitting diodes;

a light-redirecting member having a central opening allowing some light from the one or more light emitting diodes to pass, unreflected, in a generally upward direction, the light-redirecting member also having a generally downwardly facing reflective surface extending around the central opening that redirects at least some of the remainder of the light emitted from the one or more light emitting diodes away from the lamp into a surrounding environment in divergent lateral and downward directions; and a semi-transparent cover enclosing the base and the light-redirecting member;

wherein the combination of the light-redirecting member and the semi-transparent cover spreads the light substantially uniformly in all directions.

17. The optical device of claim 16, wherein:

the one or more light emitting diodes emit light in both normal and off-normal directions;

the one or more light emitting diodes extend across a diameter D greater than a diameter E of the central opening; and some of the normally directed light is reflected off of the light-redirecting member.

18. The optical device of claim 17, wherein more than half of the normally directed light is reflected off of the light-redirecting member.

19. The optical device of claim 18, wherein the light-redirecting member has a width F greater than the diameter D of the light emitting diodes, and the light-redirecting member is further configured to enable reflection of some of the light in a directly downward direction.

* * * * *